(12) United States Patent
Bonner et al.

(10) Patent No.: US 11,625,516 B2
(45) Date of Patent: Apr. 11, 2023

(54) DESIGNING A PART BY TOPOLOGY OPTIMIZATION

(71) Applicant: DASSAULT SYSTEMES, Vélizy-Villacoublay (FR)

(72) Inventors: David Leo Bonner, Vélizy-Villacoublay (FR); Claus Bech Wittendorf Pedersen, Hamburg (DE)

(73) Assignee: DASSAULT SYSTEMES, Vélizy-Villacoublay (FR)

( * ) Notice: Subject to any disclaimer, the term of this patent is extended or adjusted under 35 U.S.C. 154(b) by 1085 days.

(21) Appl. No.: 16/232,802

(22) Filed: Dec. 26, 2018

(65) Prior Publication Data
US 2019/0197210 A1    Jun. 27, 2019

(30) Foreign Application Priority Data
Dec. 24, 2017    (EP) .................................... 17306932

(51) Int. Cl.
*B33Y 50/02*    (2015.01)
*G06F 30/23*    (2020.01)
(Continued)

(52) U.S. Cl.
CPC ............ *G06F 30/23* (2020.01); *B29C 64/386* (2017.08); *B33Y 50/00* (2014.12); *B33Y 10/00* (2014.12)

(58) Field of Classification Search
CPC .................................................... B33Y 50/02
See application file for complete search history.

(56) References Cited

U.S. PATENT DOCUMENTS

2010/0134498 A1    6/2010    Pirzadeh
2011/0205583 A1    8/2011    Young et al.
(Continued)

FOREIGN PATENT DOCUMENTS

EP    1 978 487 A2    10/2008
JP    2008-257591 A    10/2008
(Continued)

OTHER PUBLICATIONS

Kukielka et al, Modern methods for modelling and analysis of technological processes of car parts and their topological optimization, 2017, p. 10 (Year: 2017).*
(Continued)

*Primary Examiner* — Suresh Suryawanshi
(74) *Attorney, Agent, or Firm* — Oblon, McClelland, Maier & Neustadt, L.L.P.

(57) ABSTRACT

The disclosure notably relates to a computer-implemented method for designing a part by topology optimization. The method comprises defining a working volume for the optimization of the part and at least one boundary condition applied to the part, computing a vector field over the working volume, each vector of the field representing an optimal direction and a quantity of material corresponding to satisfy the at least one boundary condition, computing a set of flow lines by propagating from starting points in the vector field. For each flow line of the set, an element for the primary structure of the part is computed and a secondary structure of the part linking the set of primary as well as the secondary structure elements together is computed.

20 Claims, 11 Drawing Sheets

(51) Int. Cl.
  *B33Y 50/00* (2015.01)
  *B29C 64/386* (2017.01)
  *B33Y 10/00* (2015.01)

(56) References Cited

U.S. PATENT DOCUMENTS

| | | |
|---|---|---|
| 2012/0232848 A1 | 9/2012 | Naito |
| 2014/0277669 A1* | 9/2014 | Nardi ............... B22F 10/10 700/103 |
| 2016/0096318 A1 | 4/2016 | Bickel et al. |
| 2016/0101570 A1 | 4/2016 | Iorio et al. |
| 2017/0235852 A1 | 8/2017 | Joshi et al. |
| 2017/0372480 A1* | 12/2017 | Anand ............... G06T 19/20 |
| 2018/0075184 A1* | 3/2018 | Deslandes ............ G06F 30/17 |
| 2019/0001657 A1* | 1/2019 | Matusik .............. G06F 30/23 |
| 2020/0307174 A1* | 10/2020 | Woytowitz .......... B33Y 50/02 |

FOREIGN PATENT DOCUMENTS

| | | |
|---|---|---|
| JP | 2012-185733 A | 9/2012 |
| JP | 2015-158913 A | 9/2015 |
| WO | 2015/106021 A1 | 7/2015 |

OTHER PUBLICATIONS

Zhou et al, Progress in Topology Optimization With Manufacturing Constraints, 2002, p. 8 (Year: 2002).*
Livesu et al, Form 3D models to 3D prints: an overview of the processing pipeline, 2017, Computer Graphics Forum, p. 28 (Year: 2017).*
Extended European Search Report dated Jun. 27, 2018, in European Application No. 17306932.9.
Extended European Search Report dated Jun. 27, 2018 in European Application No. 17306931.1.
Shepard et al., "Hexahedral mesh generation ter biomedical models in SCIRun," Engineering with Computers: An International Journal for Simulation-Based Engineering, Springer-Verlag, Lo, vol. 25, No. 1 (2009), Aug. 27, 2008, pp. 97-114, XP019711631.
Dumas et al., "Modelling and characterzation of a porosity graded lattice structure for additively manufactured biomaterials," Materials & Design, Elsevier, Amsterdam, NL Feb. 10, 2017, XP085097888.
Sigmund et al., "Topology optimizalion approaches: A comparative review," Structual and Multidisciplinary Optimization, vol. 48, No. 6, 2013, pp. 1031-1055, XP055485828.
Asadpoure et al., "Incorporating Fabrication Cost into Topology Optimization of Discrete Structures and Lattices," Structural Multidisciplinary Optimization Struct Multidisc Optim (2015) vol. 51: pp. 385-396.
Frey et al., Mesh Generation: Application to Finite Elements, $2^{nd}$ Edition, Wiley, Mar. 2013, (abstract only).
George et al., "The advancing-front mesh generation method revisited," International Journal for Numerical Methods in Engineering, vol. 37, Issue 21, Nov. 15, 1994, (abstract only).
Owen et al., "A Survey of Unstructured Mesh Generation Technology," Proceedings $7^{th}$ International Mesh Roundtable, Dearborn, Michigan, USA, pp. 239-268.
Valedevit et al., "Topology optimization of lightweight periodic lattices under simultaneous compressive and shear stiffness constraints," International Journal of Solids and Structures, 2015.
Office Action dated Nov. 1, 2022, in Japanese Patent Application No. 2018-240173 w/English Translation, 6 pages.
Nomura et al.-"Concurrent Optimization Method of Structural Topology and Anisotropic Material Orientation", Simulation, vol. 35, No. 4, pp. 233-239, Dec. 15, 2016.
Office Action dated Dec. 6, 2022, issued in corresponding Japanese patent application No. 2018-241420 (with English translation).

* cited by examiner

DESIGNING A PART BY TOPOLOGY OPTIMIZATION

CROSS-REFERENCE TO RELATED APPLICATIONS

This application claims priority under 35 U.S.C. § 119 or 365 to European Application No. 17306932.9, filed Dec. 24, 2017. The entire contents of the above application(s) are incorporated herein by reference.

FIELD OF THE INVENTION

The invention relates to the field of computer programs and systems, and more specifically to a method, system and program for designing a part by topology optimization.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Topology optimization (TO) is a technical field that aims at computing shapes of physical objects of the real world that satisfy design criteria. The physical object is also referred to as structure. More specifically, TO is dedicated to the optimization of material layout within a design space for a given set of constraints with the general goal of maximizing the performance of the designed structure. For example, a structure may be optimized to perform a given function with the lowest cost of manufacture and/or in operation, or perform its function better for the same cost, or improve both functions and cost at the same time.

Generally, the objective of topology optimization is to design a structural component such that material is distributed in the most efficient possible manner. The objective will typically be to create as light as possible component while carrying the appropriate loads with proper safety factors. In general, lower weight of a part causes for lower costs of manufacturing, distribution and/or operation. The most extreme case is in aerospace, where any reduction in weight results in an increase of payload, such that even the smallest of weight gains yields very large benefits.

Following the definition of constraints for the optimization—for instance designer's selections of physical conditions and boundaries of the structure, material properties of the structure, the manufacturing constraints—the optimization is computed. Two main approaches of optimization are known. The first one is continuous topology optimization, and the second one is lattice/skin (also referred to as truss/shell) topology optimization. Interestingly, there is a third approach that uses the notion of free-material optimization and that tends to some extent to unify these two approaches.

In continuous topology optimization, matter is seen as a continuous working volume, which is discretized into small finite elements for computational purposes. The process begins with the working volume, which represents a usable space that the component can occupy. Then, within this space, the optimization decides freely which regions will be filled by material and which regions will be void in order to achieve the optimal objectives. A screenshot of the result of a continuous topology optimization is shown on FIG. 5.

In lattice topology optimization, matter is distributed according to a porous scheme which alternates full and void. To be precise, in what follows we define a lattice to be any kind of porous structure in which the porosity is willful and corresponds to a function, for example, lightening the structure, providing heat exchange area or improving collapse performance in a crash. Several forms of lattice are possible. In a cell lattice, the pattern of full and void is given by a set of stacked cells analogous to the cells in a living being. In a bar lattice, the structure is seen as a network of bars connected at their ends. A screenshot of the result of a lattice topology optimization is shown on FIG. 6.

Lattice topology optimization consists in distributing material by deciding on a particular arrangement of cell units or of bars, and by varying the thickness of cell walls or of bar sections, such that the material can effectively exhibit a locally variable density, depending on whether there is a dominance of full material or void.

In fact, continuous and lattice optimization share as a common point the creation of full and void areas, but in the case of lattices the full-void transition is codified into a certain scheme, while in the continuous case the porosity appears spontaneously as a result of the presence or absence of material at a given point in space.

The free-material approach tends to unify the two above approaches, and at the same time introduces the possibility of anisotropic behavior. In this approach, the optimization considers the working space to be filled with a parametrically variable material that can span a range of densities and properties, including anisotropic properties. So, for a given region in the working volume, the result can be void (zero density), solid (full density) as well as any intermediate values. The intermediate values and anisotropic properties require interpretation in order to be realized in an actual 3D design. They can be interpreted as a composite (carbon reinforced plastic, for example) or as a microstructure (lattice). As the free-material model includes anisotropy, the interpretation requires appropriate orientation of the material.

Topology optimization often generates shapes that are too complex to manufacture by traditional means, but the recent increase in the use of additive manufacturing (also referred to as 3D Printing) has alleviated this shortcoming. Notably, additive manufacturing allows producing lattice structures. Lattice structures have a major advantage over a non-porous model, in that the material properties can be tailored to be anisotropic also for very low density structures and both at micro and macro layout level.

This is the case for any lattice structure, but particularly obvious with bar lattices: If a lattice has bars that are thicker in one direction, then it will exhibit greater stiffness and strength in tension or compression in that direction. In nature, lattice structures naturally exhibit such arrangements: in a tree, for example, the wood fibers are by far stronger in the vertical direction, because the wind or other lateral forces on the tree resolve into tension and compression in the vertical fibers of the tree trunk.

A major technical problem of background art in lattices is that no general method is proposed for creating lattices whose arrangement is to produce optimized anisotropic properties.

Within this context, there is a need for an improved method for creating lattices whose arrangement is to produce optimized anisotropic properties.

SUMMARY OF THE INVENTION

It is therefore provided a computer-implemented method for designing a part by topology optimization. The method comprises defining a working volume for the optimization of the part, defining at least one boundary condition applied to the part. The method further comprises computing a vector field over the working volume; each vector of the field represents an optimal direction and a quantity of material corresponding to satisfy the at least one boundary condition. The method also comprises computing a set of flow lines by propagating from starting points in the vector field. The method further comprises computing, for each flow line of the set, an element for the primary structure of the part, and computing a secondary structure of the part linking the set of primary as well as the secondary structure elements together.

The method may comprise one or more of the following:
the vector field over the working volume is computed using finite element model;
the vector field over the working volume is computed by an anisotropic free-material optimization that is applied for the finite element model;
computing a primary structure element of the part comprises sampling the flow line into a set of points, the set of point comprising at least one of the starting points, and computing a polyline from the set of points of the sampled flow line;
the sampling rate of the flow line is equal to a lattice length scale or to a user selected value;
the secondary structure comprises segments connecting at least one point of the set of points of a first sampled flow line to one point of the set of points of a second sampled flow line;
the segments are obtained by computing faces that connect the first and second sampled flow lines;
the faces are computed by applying a Delaunay meshing of the set of points of the sampled flow lines, triangles or tetrahedra being obtained;
computing at least one tertiary structure linking at least two ends of the set of primary structure elements together;
the at least one tertiary structure is computed for each region of the working volume that has a density of quantity of material that exceeds a threshold;
the third structure is a solid lump or a shell;
the primary structure elements computed for each flow line and the secondary structure elements are bars, two bars being connected with one solid sphere;
each bar has a section, a dimension of the section being computed from the defined working volume and defined at least one boundary condition;
identifying one or more secondary structure elements based on at least one of the following criteria:—the length of the secondary structure element exceeds a predetermined value;—the secondary structure elements is located too close from another secondary structure element; after identifying, removing the identified one or more secondary structure elements;
transferring the computed vector field on the primary and secondary structure elements closest to where they are placed on the vector field, and computing a topology optimization for each element of the primary and secondary structure elements as design variables.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

It is further provided additive manufacturing a part designed according to the method.

It is also provided a 3D printer comprising a memory having recorded thereon the computer program and/or having recorded thereon a part designed according to the method.

It provided a part obtainable by the method. The part may be a 3D part.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
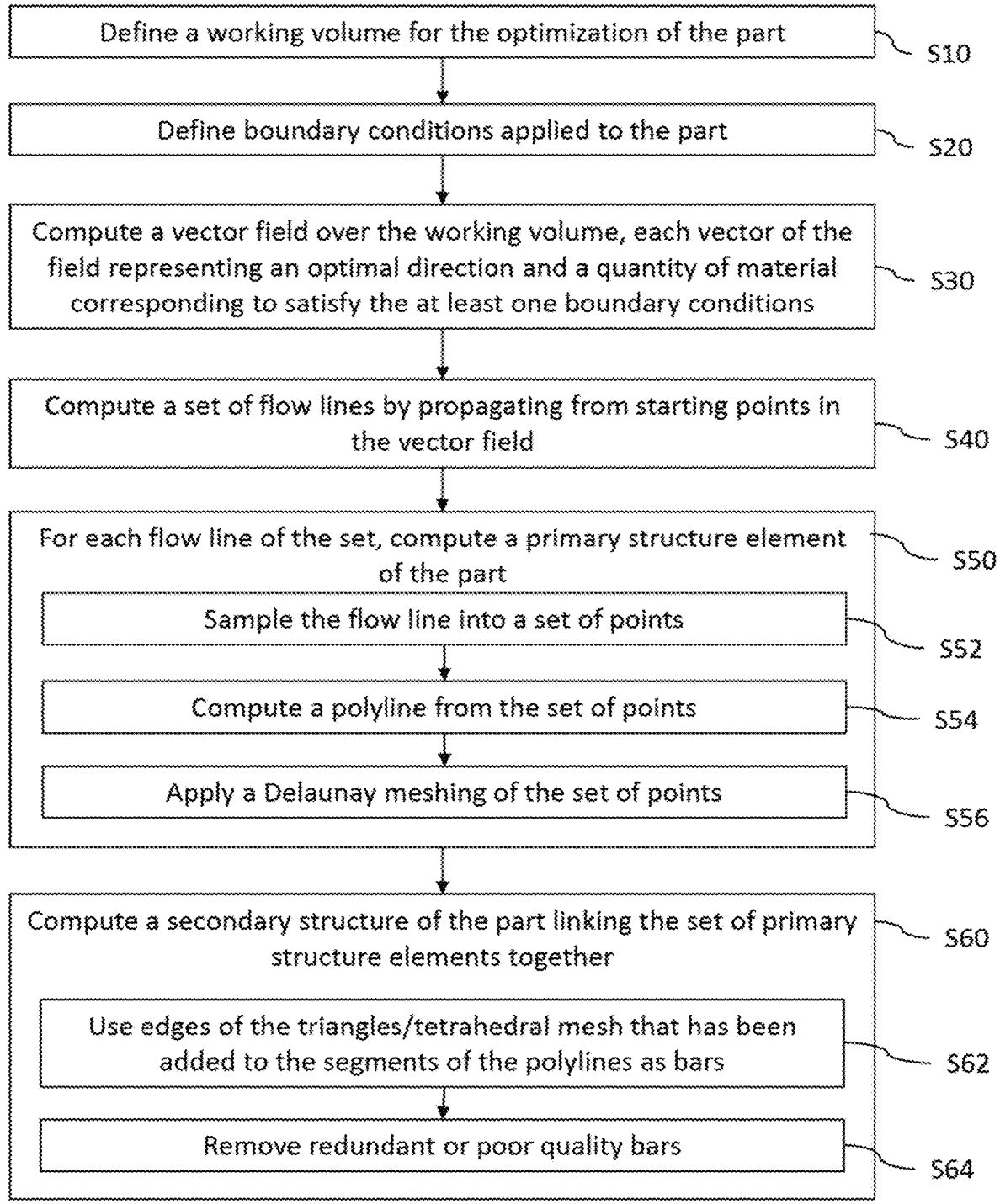
FIGS. 1 and 2 show flowcharts of an example of the method.

With reference to the flowchart of FIG. 1, it is proposed a computer-implemented method for designing a part by topology optimization, e.g. a three-dimensional part. The method comprises defining a working volume for the optimization of the part. The method also comprises defining one or more boundary conditions applied to the part. These two steps define physical conditions and the boundaries of the part to be designed have in operation. They also define how the part should be optimized relatively to these conditions. Next, the method further comprises computing a vector field over the working volume. The vector field comprises several vectors, and each vector of the field represents an optimal direction and a quantity of material corresponding to satisfy the one or more boundary conditions. Then, the method comprises computing a set of flow lines by propagating from starting points in the vector field. Each flow line is constructed (which amounts to say that each flow line is computed) as a continuous line based upon the vectors of the vector field. Flow lines are also referred to as streamlines. Then, the method comprises computing, for each flow line of the set, a primary structure element of the part. Then, the method comprises computing a secondary structure of the part linking the set of primary structure elements together.

Such a method improves the design of a part by topology optimization. Notably, the invention allows generating a three-dimensional printable physical lattice structure that captures the major directions of an oriented-density free material field of the model. The result of the oriented-density field of the model is seen as a vector field in 2D or 3D. The members of lattice structure are organized into two design layouts consisting of primary structure elements of the part and secondary structure elements of the part, respectively. The primary members are constructed by flow-line tracing the vector field, and the secondary members are constructed by connecting the primary members in order to obtain a stiff structure for bending, shearing or equivalent functionalities. A member of a lattice structure is an element forming the lattice structure and that comprises at least two connections with another element of the lattice; for instance, an element may be, but is not limited to, a tube, a bar, a beam, a pipe . . . Hence, the present invention allows creating lattices whose arrangement is to produce optimized anisotropic properties of an additive manufacturable part. Lattice-type structures are generated which are oriented by characteristic directions corresponding to an optimal anisotropic use of the material, organized into a primary structure following the characteristic directions, and a secondary structure that aims at stabilizing the primary members. Characteristically, the members of the primary structure work on a larger scale than the members of the secondary structure. Physical part can thus be produced—for instance additive manufactured—with higher performance, lower cost or both. Because the members of the lattice structure are oriented in the optimal directions prescribed by the free-material model, there is a minimum amount of material used for fulfilling the intended function of the part. This will yield two major benefits. The first one is that the mass of the designed part is reduced as better (or at least similar) performances of the designed part are obtained with a decreased consumption of material. Incidentally, this makes the part less costly to manufacture by 3D printing: indeed, all other things being equal, the cost of manufacture by 3D Printing is roughly proportional to the mass of actual additive-deposed material. The second one is that there are technical domains such aerospace and transportation domains, where a reduction in mass yields an increase in payload and over the lifetime of the aircraft, spacecraft or car so this can far outweigh the gain in manufacturing costs.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's design wishes. In examples, this level may be user-defined and/or pre-defined.

For instance, the steps of defining S10, S20 may be performed upon user action. For instance, the user selects (that is, he sets) values of the working volume and of the at least one set of boundary conditions.

A typical example of computer-implementation of a method is to perform the method with a system adapted for this purpose. The system may comprise a processor coupled to a memory. The system may further comprise a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data and CAE data. However, these systems are not exclusive one of the other, as a modeled object may be defined by data corresponding to any combination of these systems. A system may thus well be both a CAD and PLM system, a CAE and PLM system as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts, where a part may be a member of the lattice structure of the modeled object.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their tasks). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, hightech devices, medical devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A CAD system may be history-based. In this case, a modeled object is further defined by data comprising a history of geometrical features. A modeled object may indeed be designed by a physical person (i.e. the designer/ user) using standard modeling features (e.g. extrude, revolute, cut, and/or round) and/or standard surfacing features (e.g. sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (e.g. a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus, allowing decision on management or required investment. CAM is a subsequent process after a CAD process and potential CAE process. Such CAM solutions are provided by Dassault Systémes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled object into elements which physical behaviors can be computed and simulated through equations. Such CAE solutions are provided by Dassault Systémes under the trademark SIMULIA®. Another growing CAE technique involves the modeling and analysis for complex systems composed of a plurality components from different fields of physics without CAD geometry data. CAE solutions allow the simulation and thus the optimization, the improvement and the validation of products to manufacture. Such CAE solutions are provided by Dassault Systémes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PEW solutions are provided by Dassault Systémes under the trademark ENOVIA®.

Figure 3:
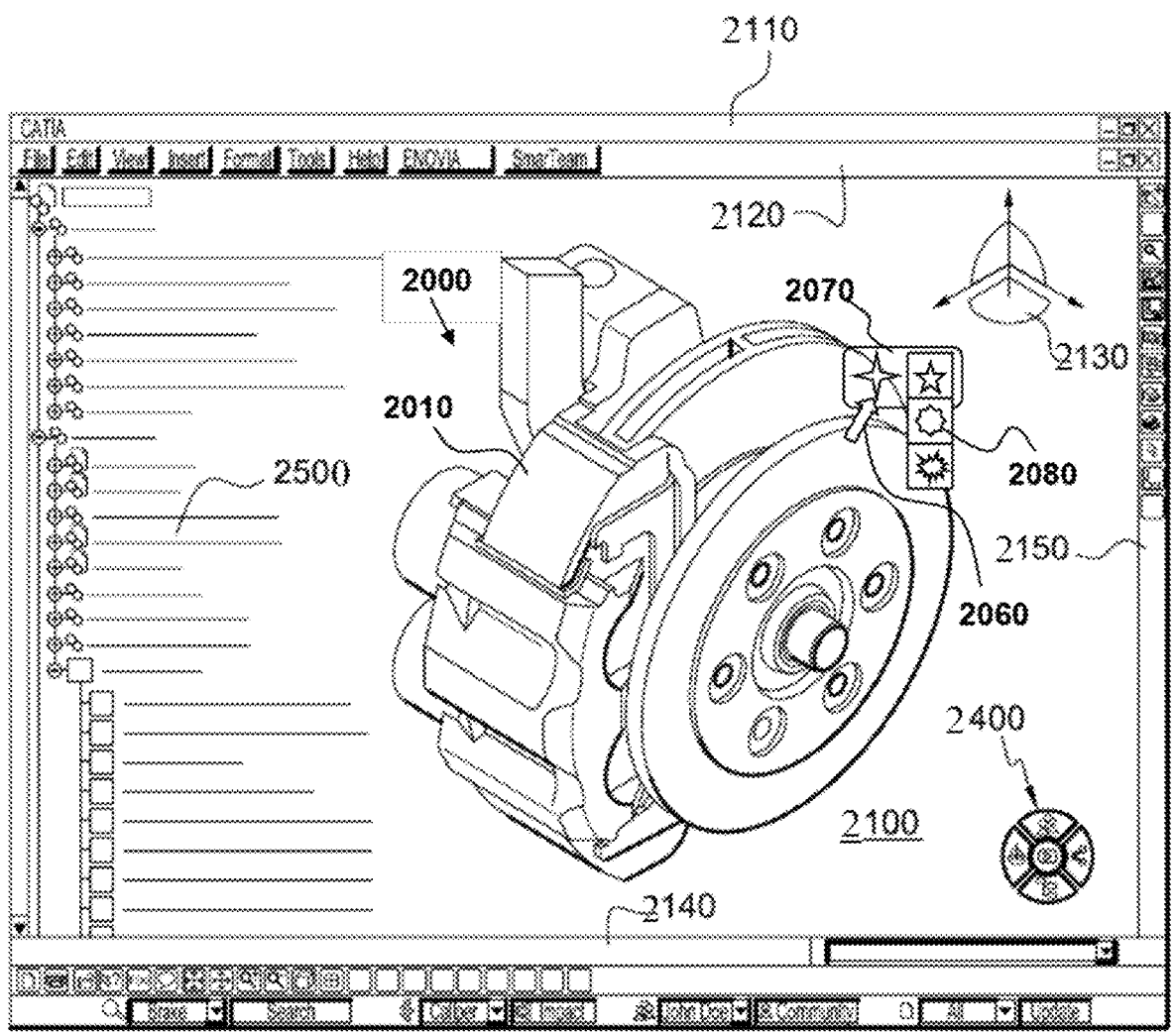
FIG. 3 shows an example of a graphical user interface of a CAD system.

FIG. 3 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2050 may be controlled by a haptic device to allow the user to interact with the graphic tools.

Figure 4:
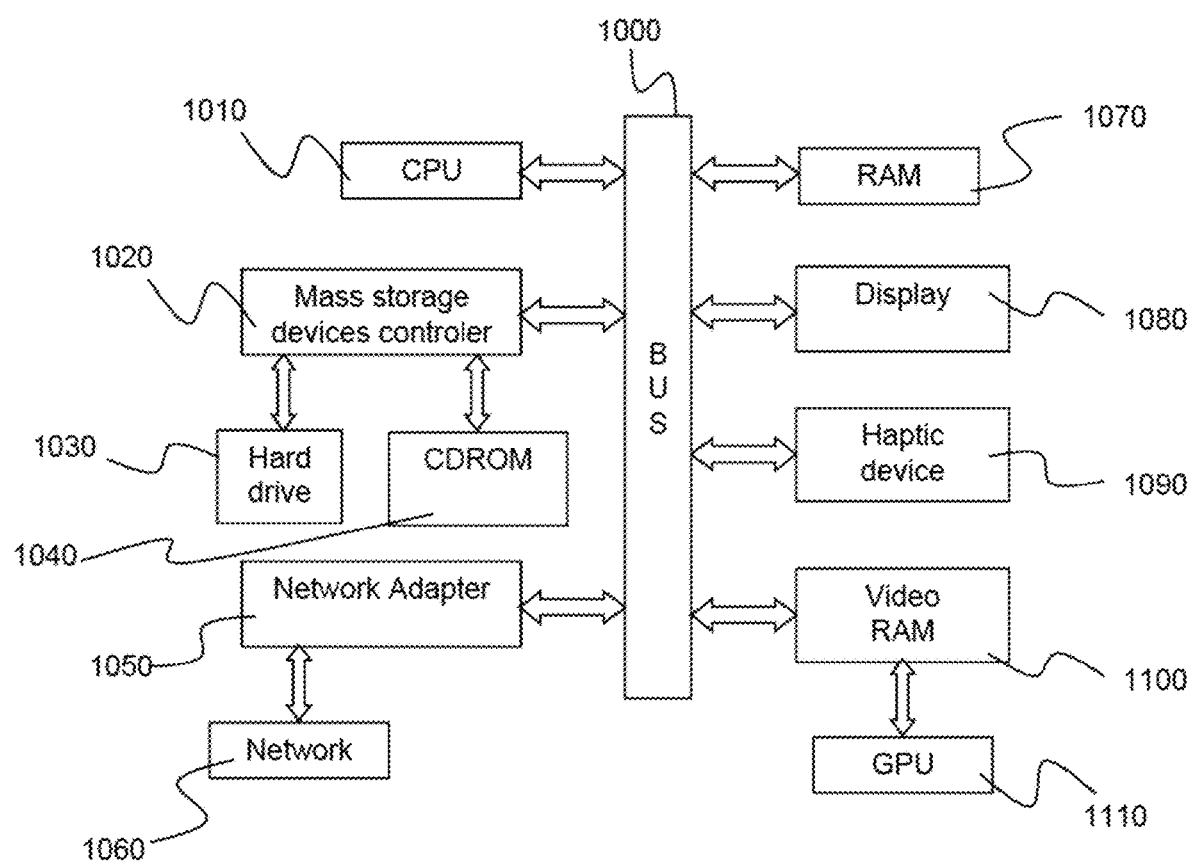
FIG. 4 shows an example of the system.
Figure 5:
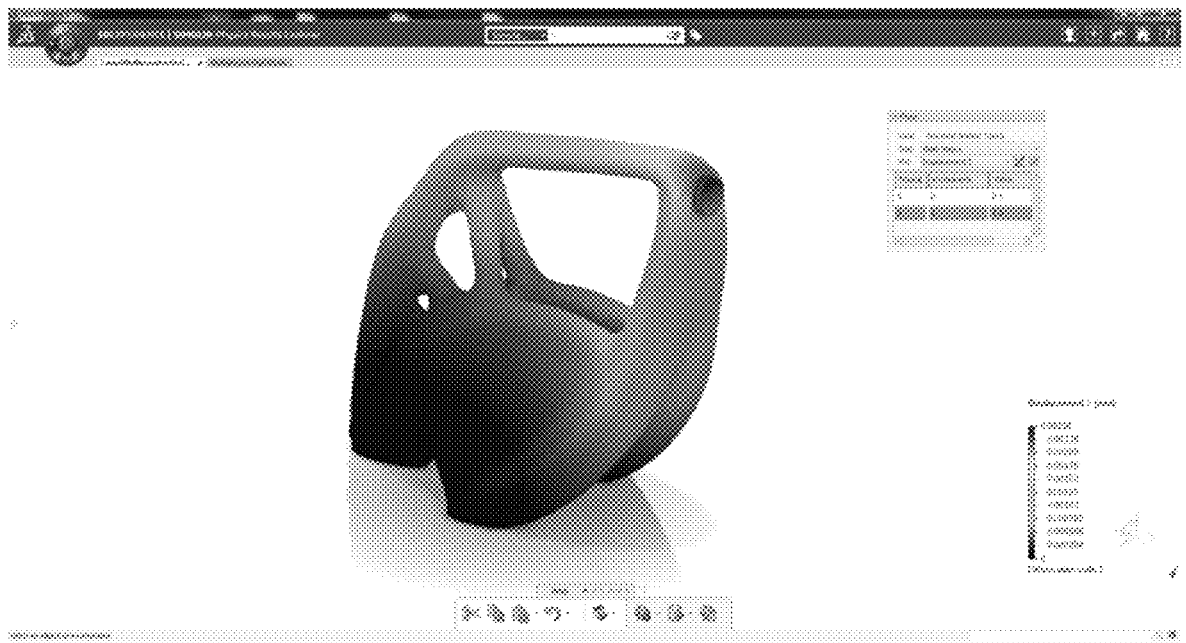
FIGS. 5 and 6 show screenshots of topology optimization.
Figure 6:
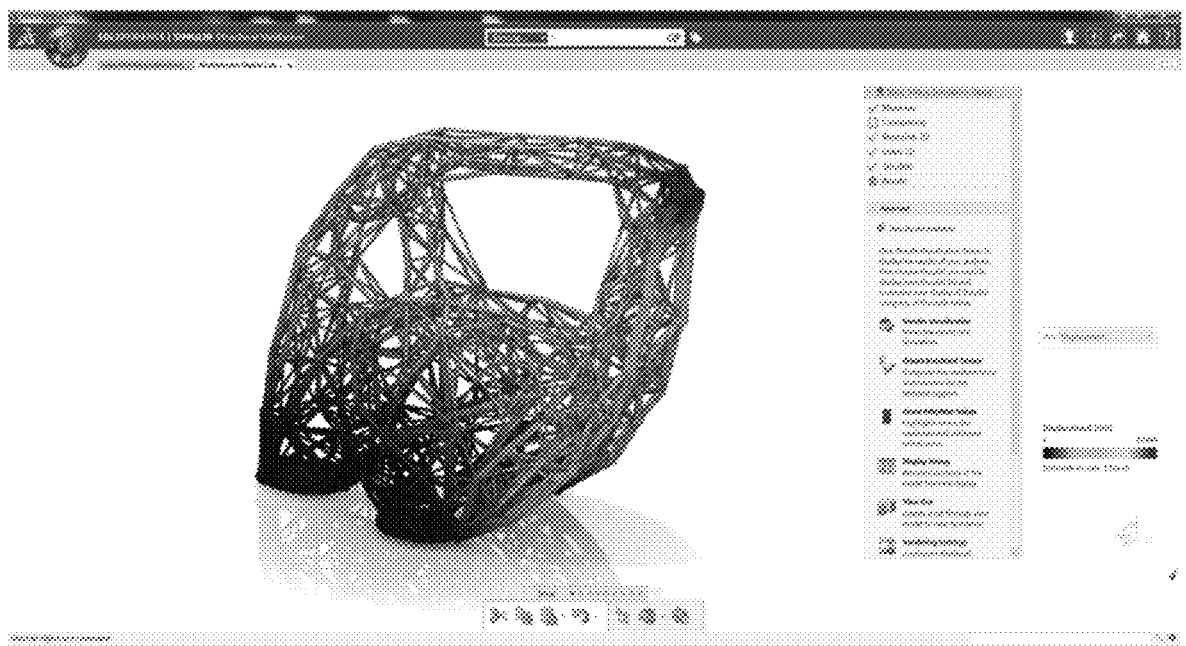

FIG. 4 shows an example of the system, wherein the system is a client computer system, e.g. a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for the performing of the method.

"Designing a part by topology optimization" designates any action or series of actions which is at least part of a process of elaborating a 3D modeled object or part. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. Typically, the physical product is additive manufactured or 3D printed. In any case, the modeled object, designed by the method, represents a manufacturing object. The modeled object can thus be a modeled solid (i.e. a modeled object that represents a solid). The manufacturing object can be a product, such as a part, or an assembly of parts. Because the method improves the design of the modeled object, the method also improves the manufacturing of a product and thus increases productivity of the manufacturing process. Notably, as already mentioned, the method of the invention allows generating a 3D printable physical lattice structure that captures the major directions of an oriented-density free material field of the model.

Referring now FIG. 1, at step S10, a working volume (noted Wv) for the optimization of the part is defined. The working volume is the maximum allowable space that the final design can occupy. Thus, and by extension, defining the working volume may also involve that a 3D volume is defined, that is, a 3D shape comprising the working volume is defined. The 3D shape may be a regular geometric shape such as but is not limited to a parallelepiped, polyhedron, . . . or a free shape that may be drawn by the user. The working volume may be selected upon user action, e.g. the user sets the dimensions of a 3D shape defining the working volume. The working volume may be automatically set, e.g. the computerized system performing the method provides a 3D shape and its dimensions.

At step S20, one or more boundary conditions that are applied to the part are defined. For instance, one or more sets of boundary conditions can be selected (or defined) for defining the modeling. As with step S10, the one or more boundary conditions can be selected upon user action, e.g. the user sets values or the characteristic of the boundary conditions. Boundary condition(s) may also be automatically set by the computer system, e.g. default boundary conditions are provided by the system.

A boundary condition may be a constraint on the working volume such as but is not limited to a force, a restraint, an internal boundary within the working volume, temperature (for instance of the material of for the designed part), acceleration (for instance gravity loading), couplings between different degrees of freedom at different locations of the part (for instance in mechanism design) . . .

A boundary condition may also comprise the definition of a volume fraction. The volume fraction (VF) represents a percentage of filing of the working volume Wv defined at step S10. The volume fraction may be a scalar with a value comprised from 0 to 1, 0 and 1 being included in the range of values. The volume fraction defines the mass of the final part: $Mp=Wv*VF*D$ where D is the density of the material in the hypothesis the same material is used for the complete part.

A boundary condition may also comprise optimization goal of the topology optimization. Optimization goal is a characteristic of the designed part the function of the topology optimization has to maximize or minimize. For instance, the optimization goal may be minimum compliance for given mass, maximum stiffness for given mass, minimize the highest stress for given mass or maximizing the lowest modal eigenfrequencies.

A boundary condition may further comprise a finite element formulation of the problem. The formulation of the problem may result in a system of algebraic equations or in parameterized elemental matrices, as known in the art.

A boundary condition may also comprise the definition of the Finite Element length scale and of the lattice length scale as well as imposing geometrical constraints often aiming on enforcing manufacturing constraints.

For each of the above-mentioned examples of boundary condition, they may be selected and/or defined upon user action or automatically by the computer system that performs the method, e.g. value by default.

Figure 7:
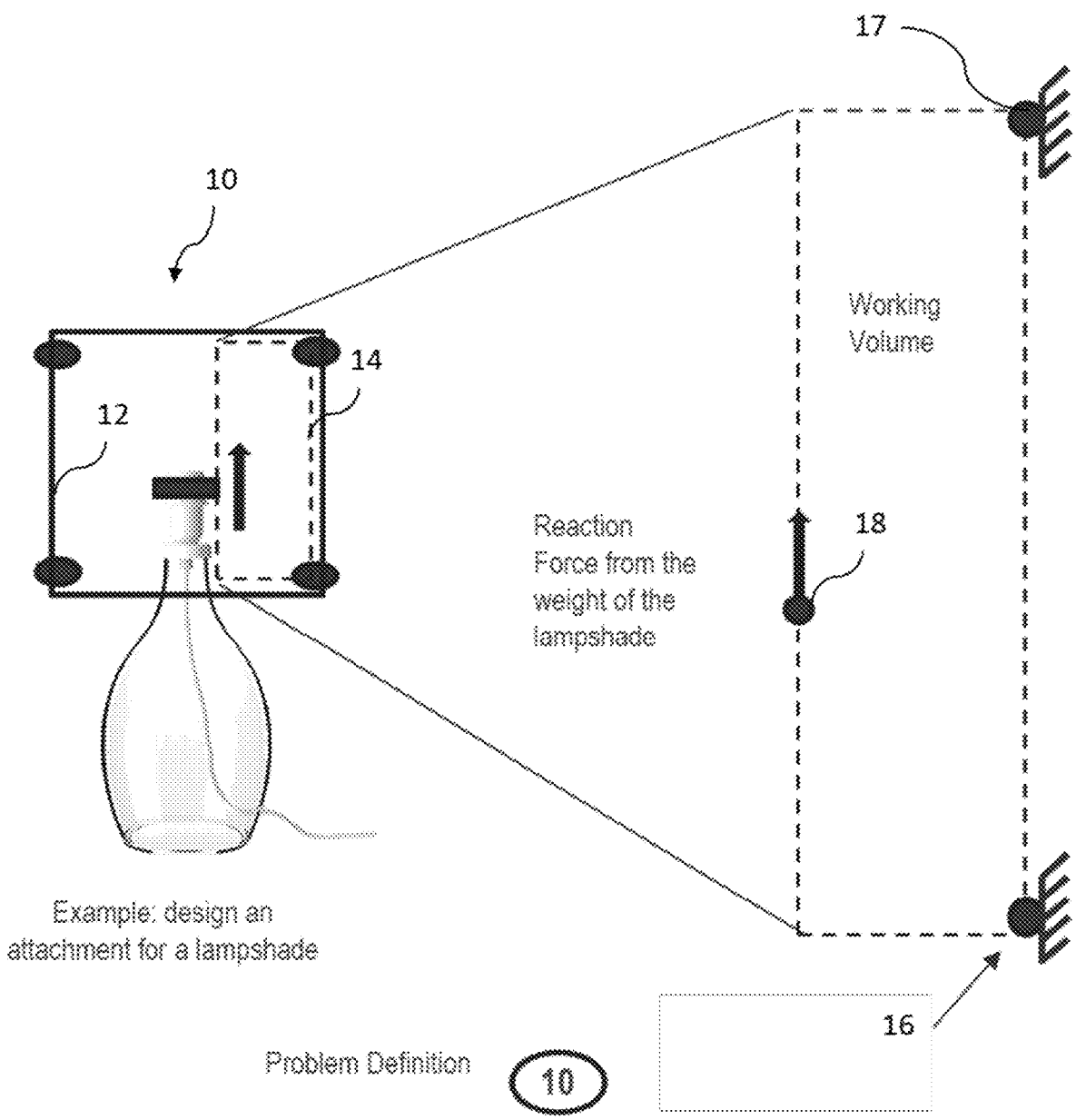
FIGS. 7, 8, 9, 10, 11, 12, 13 and 14 show an example of design an attachment for lampshade according to the present invention.

FIG. 7 schematically illustrates an example of the steps S10 and S20. These two steps can be performed concomitantly or one after the other. In this example, the designer has selected a lamp support as 3D modeled object 10 and wishes designing an attachment 14 for a lampshade 12. This lamp support, the lampshade and the attachment to be designed are part of a lamp product to be manufactured. The parts are typically loaded and displayed into a GUI as a result of the designer's action, e.g. on a CAD or CAE system. It is to be understood that no display of the part designed by the method is required.

Still in reference to FIG. 7, the designer has selected a working volume (represented with dotted lines) the attachment to be designed as well as boundaries conditions that are two attachment points 16, 17 to the lampshade and one reaction force 18. The reaction force is represented by a vector that starts from a point, and this point will be also used as starting point at step 540.

Hence, the designer specifies at steps S10, S20 what physical conditions and boundaries the component has in operation, and how the component should be optimized relatively to these conditions. For example this can be applied forces, in which case usually the optimization will try to reduce the weight while maintaining appropriate robustness, but it can also be rates of heat transfer, for example maximizing heat transfer for a given weight, or vibrational excitation, for example minimizing the impact of certain modal eigenfrequencies, while maintaining a given weight. Typically, at this point the user will also define the base material properties. It is possible that more than one base material will applied, or a continuous range of base materials. For example, the latest 3D printing technologies can produce different steel alloys in different areas of the same component. If it is known in advance that the component will be produced with such a printer technique then the possible range of alloys will be part of the specification of the design problem. Likewise, the manufacture process may consider a finite list of materials, of which one or more might be assembled to produce the final part, in which case this finite list will be part of the specification, and the optimization process seeks to choose the best set of materials.

Finally, the user might want to give manufacturing constraints in order to ensure that parts will be feasible to produce, for example by specifying a minimum wall thickness of the structures of the designed part, or a printing direction, or a de-molding direction, or other characteristics being specific to a manufacture process. In the case of 3D Printing (additive manufacturing) for metallic parts, the design shape freedom is significant—especially, there is no de-molding constraint—but a common requirement is that the part is not allowed to have any overhangs at a given angle or any closed voids. This is because the printing is usually performed by melting a fine powder, and if the part has closed voids these will be full of powder and it will not be possible to empty the part for enclosing the powder.

Then, at step S30, a vector field over the working volume is computed. Each vector of the field represents an optimal direction and a quantity of material corresponding to satisfy the at least one boundary conditions. This amounts to say that a vector field for an oriented density of the part is computed.

The working volume of step S10 may be discretized into small finite elements for computational purposes; therefore, the vector field over the working volume is computed using finite element model. The size of the cells may be determined by a value which is called finite element length scale; thus, the finite elements of the working volume are obtained in accordance with the finite element length scale that may be defined at step S20, e.g. the designer sets a value or the system provided automatically a value (for instance a value by default). The discretization is performed as known in FEM.

If the working volume has been divided into finite elements, each cell comprises one vector representing the optimal direction of the given cell and the quantity of material corresponding to satisfy the at least one boundary conditions for the cell.

The optimal direction of the material of the designed part and the quantity of material of the designed part corresponding to satisfy the at least one boundary conditions may be computed density using a grid of anisotropic finite elements, their size being determined by the Finite Element Length Scale. This computation may be done by a free-material, density-based topology optimization approach, using the working volume defined at step S10 and the at least one boundary condition defined at step S20 such as, but not limited to, constraints on the designed part, volume fraction, goal of the optimization such as, but not limited to, minimum compliance for minimize mass, maximum stiffness, fulfill strength and failure requirements using stress constraints, maximizing a lowest modal elgenfrequencies . . . Thus, the vector field over the working volume is computed by an anisotropic free-material optimization that is applied on the finite element model. This computation is performed as known in the art of FEM; and any method may be used if suitable for computing the above-discussed vectors of the vector field.

Figure 9:
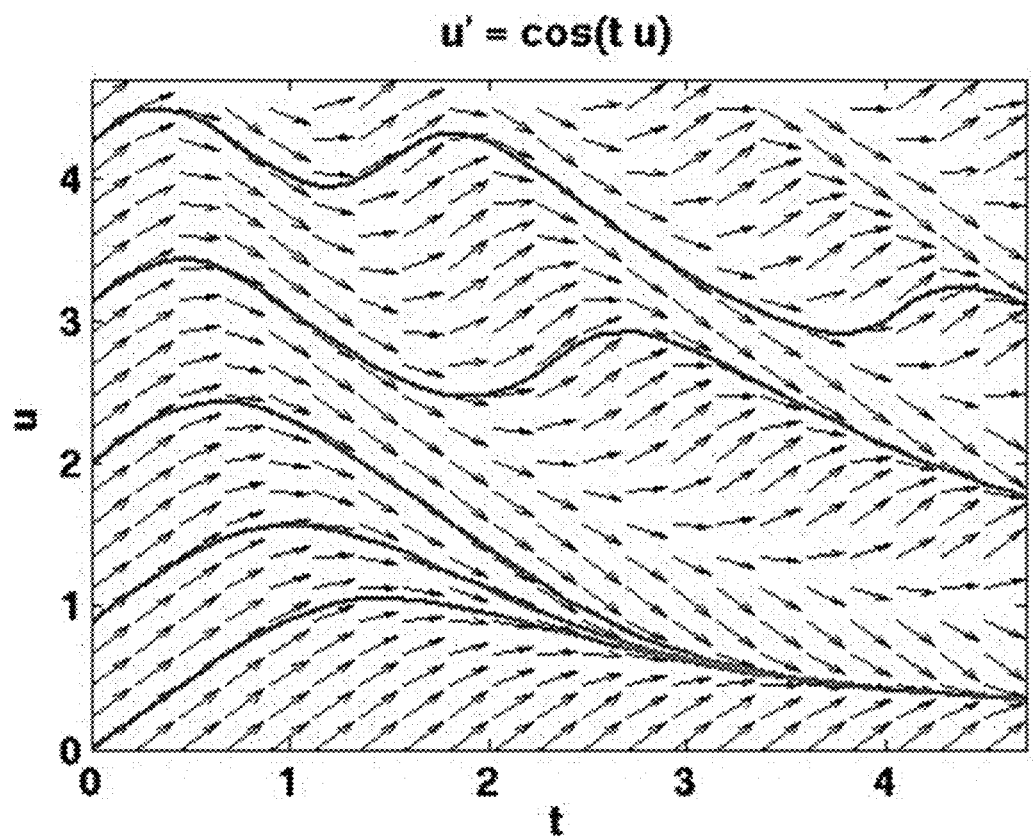

FIG. 9 illustrates an example of vector field that is obtained as a result of step S30. Each arrow of the figure represents the optimal direction of the material of the designed part and the quantity of material of the designed part corresponding to satisfy the at least one boundary conditions. The vector field thus represents the solution to a constrained optimization problem; the problem has been defined at steps S10 and S20. For the sale of clarity of the figure, the cells discretizing the working volume are not represented.

At step S40, a set of flow lines is computed. The computation is carried out by propagating from starting points in the vector field. The flow lines are also referred streamlines in the literature. The computation of the flow lines (or streamlines) is performed as known in the art. For instance, the document McLoughlin, R. S. Laramee, R. Peikert, F. Post, M. Chen, "Over Two Decades of Integration-Based, Geometric Flow Visualization", In Computer Graphics Forum, 29(6), pp. 1807-1829, 2010 discloses an example of computation of flow lines on a vector field.

Back to FIG. 9, flow lines (streamlines) on the vector field are represented by continuous lines; there are in this example five flow lines. The set of lines computed depends on the choice of starting points: here there five starting points u={0,1,1,3,4}, t=0. The starting points may be selected by the designer, or that may be automatically provided by the system for example using information about boundary conditions or the locations of the highest relative material locations or other approaches. The starting points are selected before the step S40 is performed, for instance at the step S20. The spacing between the computed flow lines may also be configured upon designer's action, or by the system. The spacing of the flow lines streamlines can be set by a value of a parameter which is called here defined as Lattice Length Scale: the Lattice Length Scale point may be selected by the designer, or that may be automatically provided by the system. The spacing of the flow lines is the minimal distance between two flowlines. The distance may be an Euclidian distance in the working volume.

Figure 8:
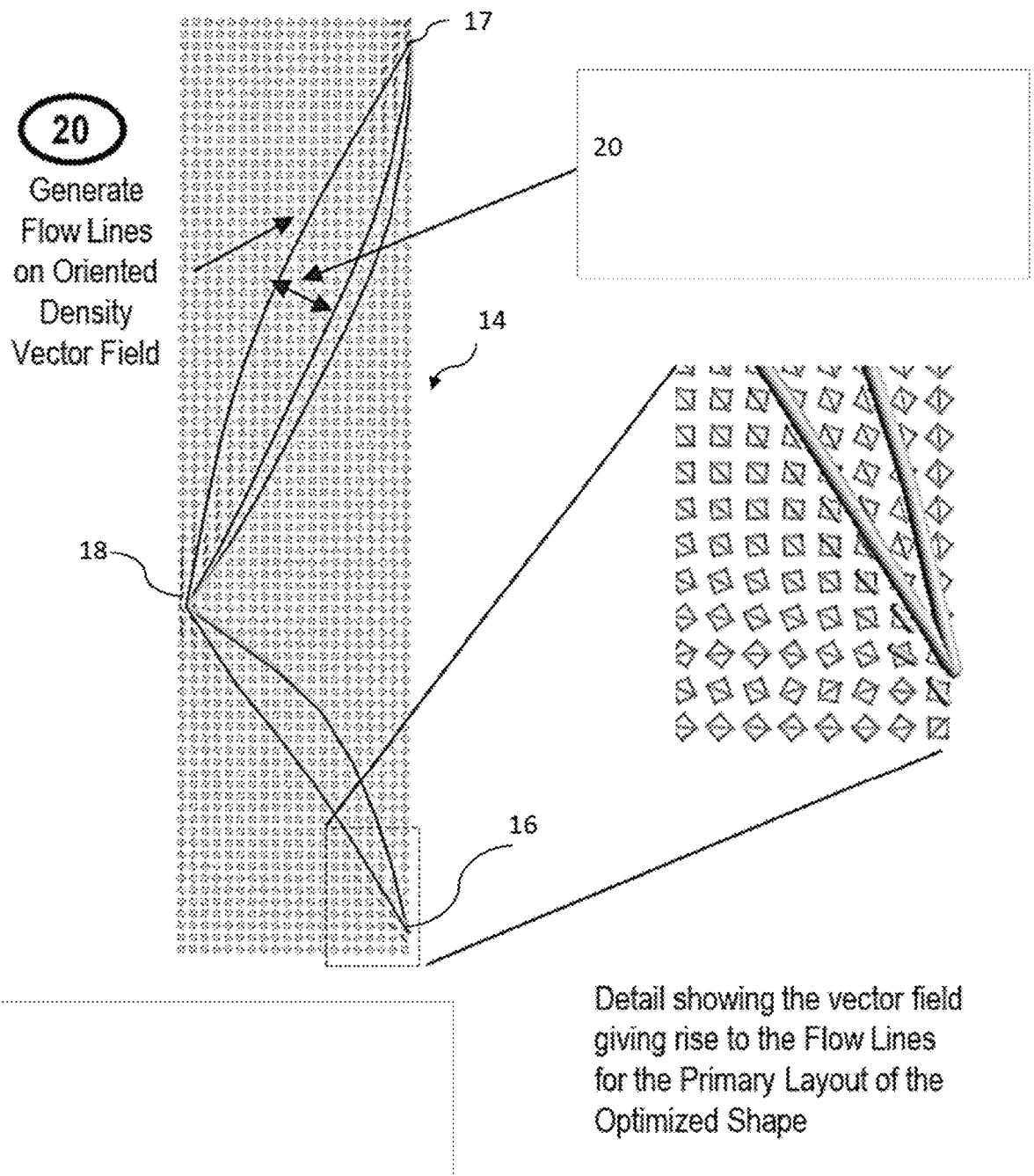

FIG. 8 shows the computed oriented density vector field 20 of the working volume 14 obtained by using anisotropic optimization. Flow lines have been generated from a starting point 18 which is actually the point in the working volume from which the reaction force of the designed part (about the lamp support). Arrival points are the points of the working volume on which flow lines end or are converged. In the example of FIG. 8, there are two ending points (as opposed to starting point) that are the two attachment points 16, 17.

Still in reference to FIG. 8, on the right part of the figure, it is shown details of the vector field 20 giving rise to the flow lines that converge to the ending point 18. Interestingly, the computed flow lines follow the vectors of the field that have a more important thickness compared to the other vectors; the thickness represents the quantity of material corresponding to satisfy boundary condition(s). The flow lines are thus the paths in the working volume of the ideal structure. The set of flow lines form a primary layout of the optimized part being designed.

Next, at step S50, a primary structure element of the part is computed for each flow line of the set. A structural element is a 3D modeled object (or part) that forms the members of the part or part being designed. For instance, a structure element may be a bar, which is a shape with an elongated form: indeed, the flow line are lines and the bar follows the flow line. The bar may have a geometrical section such as but not limited to a cylindrical section, or a square section, or a mix both, or even no geometrical section. A bar has a shape that ensure that the requirements involved by the, field of vector are implemented.

Then, at step S60, a secondary structure element of the part is computed. This secondary structure element links between the set of primary structure elements. Linking the set of primary structure elements means that each primary structure element obtained at step S50 is connected with at least one another primary structure. Here, two primary structure elements are said linked if the second structure element is difference of the two linked primary structures; this notably excludes the case in which two primary structures are linked if at least one of their respective ends are tied.

Steps S50 and S60 determine an optimized topology of the primary and secondary structure elements of the part. This determination process may comprise an identification and classification of the orientations of the computed oriented density vector field that describe the anisotropic properties of the primary and the secondary structure elements, and members of the topology optimized part. For instance, the identification and classification may comprise identifying and classifying the various scales for the properties of the primary and the secondary elements and members of the topology optimized part. The scales may be, but are not limited to, macro scale or micro scale. The topology of the primary and the secondary structure elements of the part (comprising members of the part) is optimized for lightweight structural design and for fulfilling structural requirements as for example for, but not limited to, stiffness, strength, failure, modal eigenfrequencies, etc. in an example, the primary structure can be identified and classified as lightweight immense reinforced concrete members compared thin secondary wires as on a hanging bridge. In another example, the primary structure can be identified and classified as bulky beams with bending stiffness compared to thin secondary bars with hardly any bending stiffness.

It is now discussed in example for building (or computing) the first and the second structure elements of steps S50 and S50.

A step S52, each flow line computed at step S40 is sampled into a set of points. A set of point comprises at least one of the starting points. The sampling rate of the flow line may be selected by the user or by the system. Here the term "sampling rate" means the number of points for a given distance; the distance may be an Euclidian distance. Alternatively, the sampling is done according to a sampling step value that may be equal to the lattice length scale or equal to a designer defined length scale. In both cases, the value may be equal to the lattice length scale or equal to a designer defined length scale.

Once a flow line has been sampled, a polyline is built (or computed) from the set of points of the sampled flow line (S54). The computation of the polyline is performed as known in the art.

From now, the secondary structure can be built. The second structure may comprise segments (S62) that connect at least one point of the set of points of a first sampled flow line to one point of the set of points of a second sampled flow line. As already mentioned, the presence of the secondary structure excludes the case in which two primary structures are linked if at least one of their respective ends are tied. The segments may be bar that may be similar in shape as for the bars discussed in reference to the primary structure elements.

In an example, the segments of the second structure are obtained by computing faces that connect the first and second sampled flow lines. Faces may be, but are not limited, too triangles or tetrahedra. Thus, geometries are computed between two sampled primary structure elements. Edges between two consecutive points, and/or points of a primary structure element may be used for obtaining the computed faces. For instance, a triangle may comprise an edge of a first sampled flow line and a point of a second sampled flow line: segments connecting the two flow lines comprises the two edges that connect the point of the second sampled flow line to the ends of the edge of the first flow line.

In an example, the faces are computed by applying (S56) a Delaunay meshing of the set of points of the sampled flow lines, triangles or tetrahedra being obtained. The Delaunay meshing is performed as known in the art. It creates triangles in 2D or tetrahedra in 3D. Interestingly, the Delaunay meshing allows to optimally compute the faces connecting two first structure elements.

Figure 10:
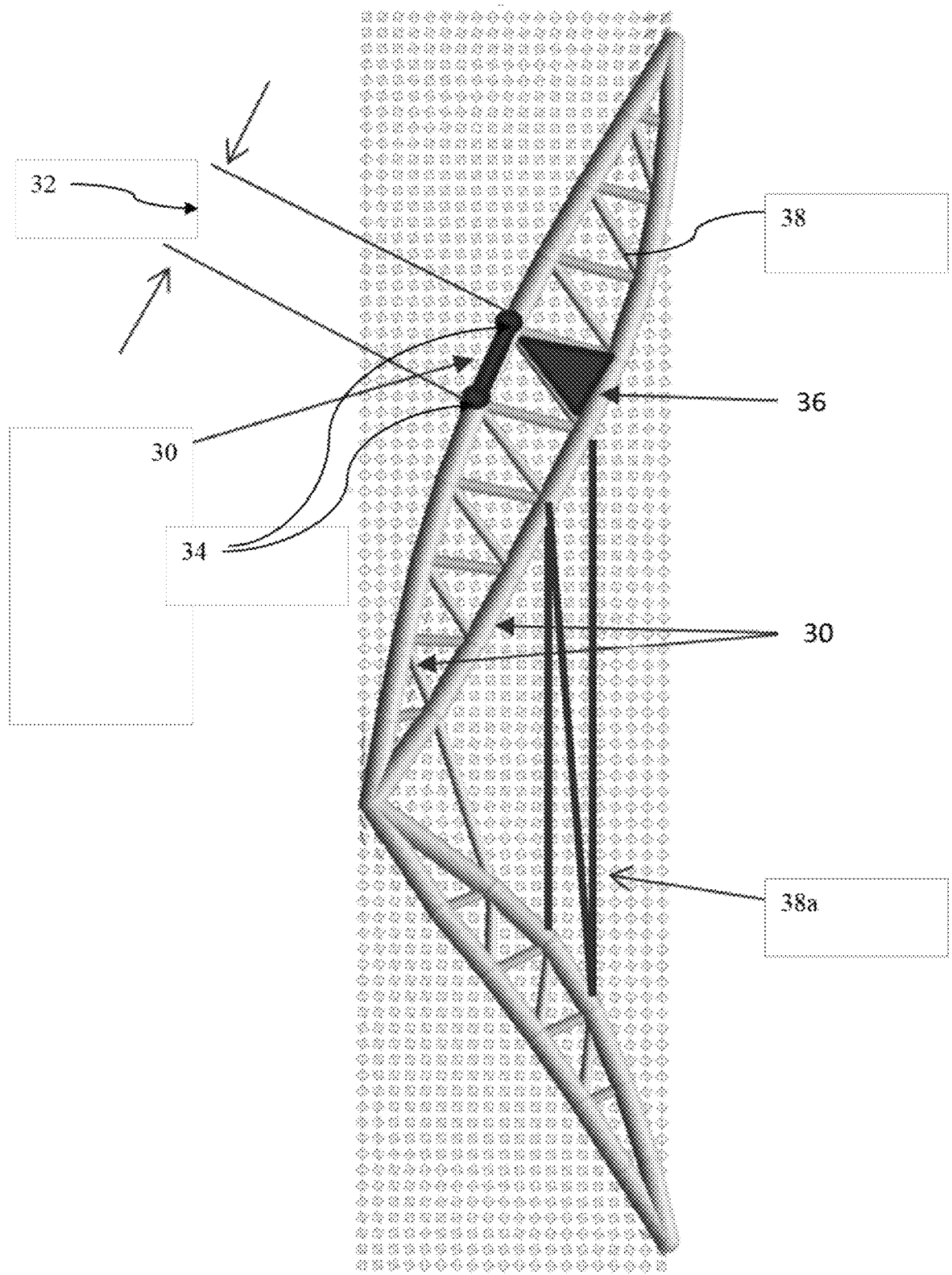

FIG. 10 illustrate an example of creation of the primary and secondary structures. After the creation of the primary structure elements illustrated on FIG. 8, polylines for the primary layout has been generated by sampling the flow lines; here at step equal to the lattice length scale. Thus, each flow line is divided into connected segments 30 of a length 32. Then, a Delaunay mesh has been applied to the poly line points 34 to generate a set of triangles 36 in 2D and tetrahedra in 3D. A secondary layout is created using the lattice bars 38 from the edges of the triangle/tetrahedra mesh added to the segments of the poly-lines from the flow lines. In the example of FIG. 10, each segment and edge that contributes that the first or second layout is a bar.

At this step of the method, a part has been designed by topology optimization. Now, further optimization may be performed.

At step S64, redundant or poor quality bars (that is, segments) are removed. More generally, unwanted bars are removed, e.g. for the contribution to the mechanical performance. Redundant segments of the secondary structure are removed. A segment is redundant when its presence does not contribute to improve the structure. In an example, redundant segment(s) is (are) automatically detected by use of a defined threshold of contribution to the stiffness; if by removing the segment, the computed stiffness diminishes by less than this defined threshold, the removed segment is considered redundant. For instance, if a member in a part contributes less than 0.01% of the total stiffness it can be removed. Interestingly, the computation of stiffness of a truss is quite economical in term of computation resources (e.g. CPU), taking only a few seconds for typical cases, so it is quite feasible to do this test for even hundreds of segments that are candidates for redundancy. The removal may be performed upon user action or automatically upon detection by the system of the redundant segments.

Poor quality-segments comprise segments that are too long, e.g. the maximal length of a segment is predetermined upon user action or automatically determined by the system. In an example, a common criterion (but not the only possible) is to consider a poor-quality segment to be one that is excessively slender, meaning that its diameter is too small relative to its length. The principle behind this is to prevent buckling failure. Buckling failure is what happens when an excessively slender beam is loaded in compression—it fails by becoming unstable. Furthermore, since the minimum diameter of a bar in a lattice is usually imposed by the smallest feature size of the 3D Printer, an upper limit to slenderness can be set by simply limiting the maximum length of a segment in the structure; and this upper limit to slenderness will in turn effectively prevent any failure by buckling. Alternatively, buckling failure could also be prevented by computational optimization that would identify the buckling modes of the structure, but this is an expensive nonlinear calculation. Poor quality segments also comprise ill-configured segments that are issued from bad quality triangles or tetrahedra. Indeed, generating a set of connected triangles or tetrahedra subject to some geometric constraints is a process called meshing and it is always subject to the risk of generating poor quality elements. Poor quality segments also comprise the secondary structure elements that are located too close each other. For instance, a minimal average distance between two segments connecting first structural elements has to be observed; this minimal average distance may be set by the designer or by the system.

On FIG. 10, the bars in black 38*a* are identified as being of poor quality as they are too long. Consequently, they are removed.

Figure 2:
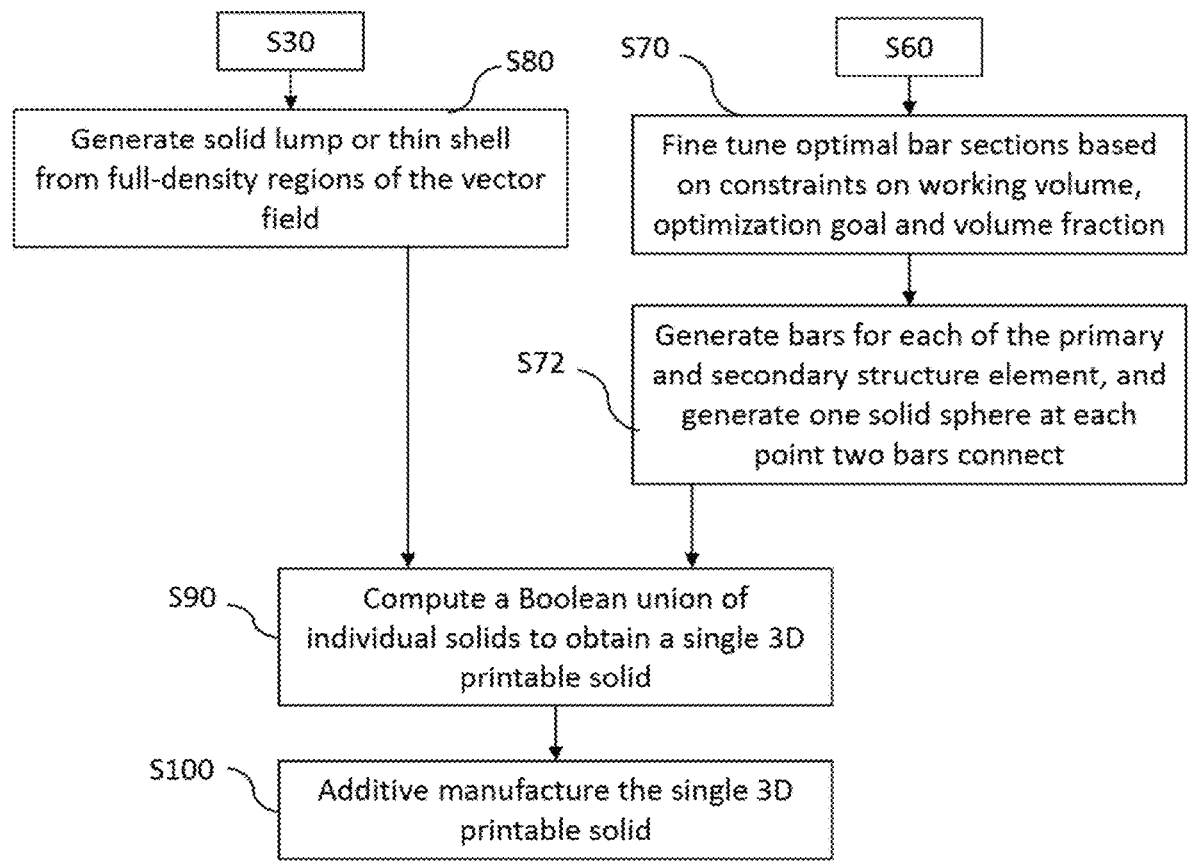

FIG. 2 shows further optimizations that may be applied on the part designed by the invention. These optimizations can be applied even if the step S64 has not be performed.

At step S70, the boundary conditions defined at step S20 are applied again on the points of the sampled primary structure elements. Especially, constraints defined at step S20 (forces, restraints, temperatures, . . . ) are re-applied on the nodes of the bar network constructed as a result of steps S10 to S62 or S64. Applying again the boundary conditions is carried as known in the art. In an example, boundary conditions are re-applied by transferring the said boundary conditions (for instance the constraints) to the node or nodes closest to where the said boundary conditions were placed on the continuous working volume. In other words, the oriented density model computed at step S30—that is, the computed vector field over the working volume—is replaced by the primary structure elements and the secondary structure elements.

A new sizing optimization may be now computed for each element of the primary and secondary structure elements as design variables, that is with all the node positions fixed and with the bar sectional areas as design variables. This step S70 of computing a sizing optimization (or topology optimization) provides for fine tuning of the structure so that each bar has the optimal cross section typically, using sensitivity based optimization algorithms but not limited to that optimization approach. Document "Topology Optimization, Theory, Methods, and Applications" Bendsoe, M. P., Sigmund, O. 2nd ed. 2003. Corr. 2nd printing, 2003, XIV, 370 p., Hardcover ISBN: 978-3-540-42992-0, Chapter 4, "Topology design of truss structures" provides a non-exhaustive discussion of techniques that can be used to optimize the cross-sections of bars in a truss structure. Step S70 can take into account also full-density regions optionally produced from the oriented density field. Such full density regions will remain invariant but will participate in the structural model during the optimization.

At step S72, the newly optimized part is regenerated taking into account of the results of the step S70. The segments are modified for each of the primary and secondary structure elements with an optimal section for each segment. In practice, the design modified segments are solid cylinder, thus making easier the computation of their optimized section. For each point of the primary structural elements, one solid sphere at each point two segments connect is computed; this comprises node of the first and second structures and nodes of the first structures elements only. Preferably, the spheres are dimensioned such that they are slightly larger than all the incoming cylinders for example for avoiding strength and failure issues. The larger sphere diameter reinforces the joint, which can be desirable for structural reasons. In addition, it can be desired to compute the geometric representation of the lattice in a CAD via Boolean operations, in which the bars are added together with the connecting spheres. In such a Boolean operation, there is a requirement to avoid any tangent surfaces. By having the joint be a bit larger than the incoming bars, tangency is avoided, and the geometric operation becomes reliable.

Figure 11:
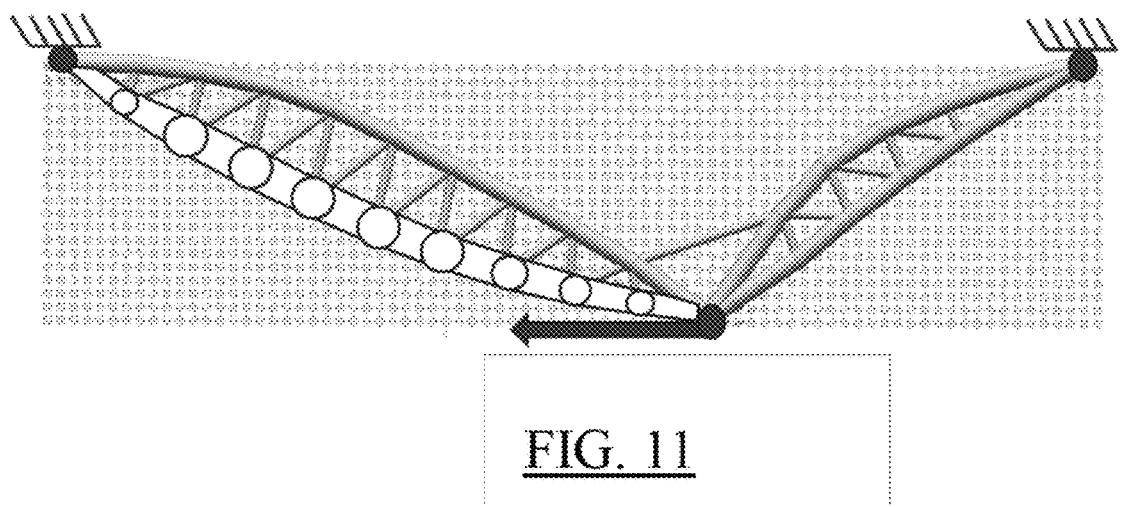

FIG. 11 illustrates the result of steps S70-S72 for one primary structure element.

Concomitantly, before or after the step S70-S72 is performed, a solid lump or thin shell can be generated from full-density regions of the vector field. The generation of the solid lumps or shells thus results from the interpretation of the oriented density vector field as solid material when the density is over a certain threshold. The lumps or shell strengthen the part in regions with high density of material in the part being designed. In practice, the lumps or shell are tertiary structures linking at least two ends of the set of primary structure elements together.

Figure 12:
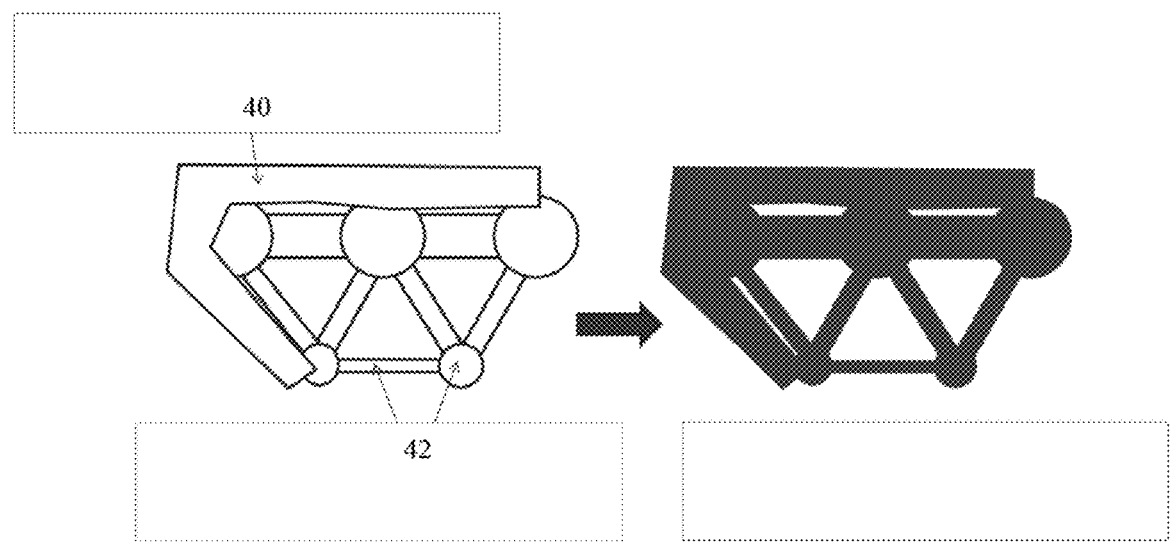

FIG. 12 shows an example of the solid lump that is an additional material added at the result of step S80.

Then, at step S90, a Boolean union of individual solids is computed to obtain a single 3D printable solid. At this step of the method the individual solids are generated bars that may be cylinders, the nodes, and the solid lump or thin shell. The Boolean union produces a new mesh of that describes the boundary of the topologically optimized part. The Boolean union is performed as known in the art. FIG. 12, right part, illustrates the result of the Boolean union.

Figure 13:
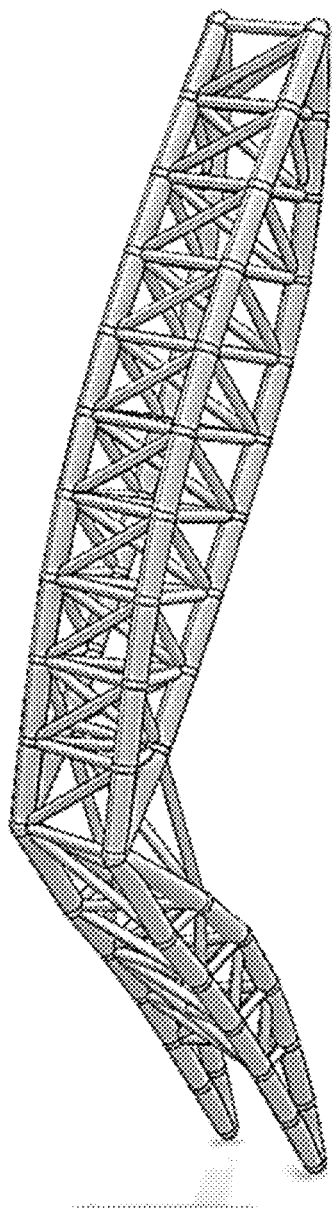
Figure 14:
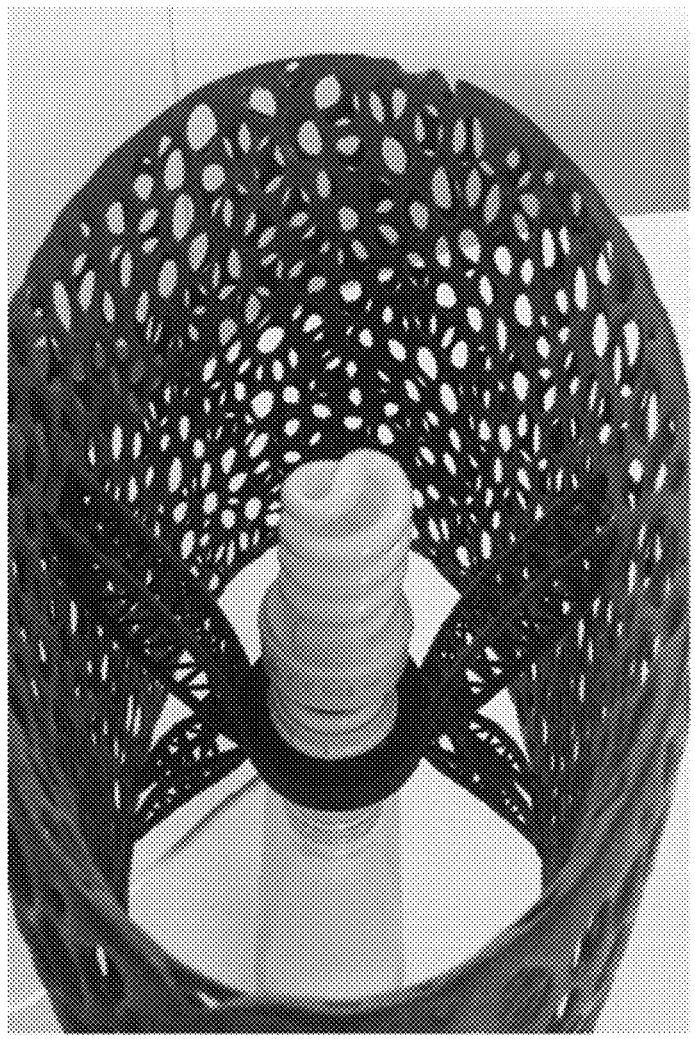

FIG. 13 shows an example of the attachment for lampshade 3D object that is obtained as a result of the invention. The designed support structure is a lattice structure with optimized anisotropic properties. This part represented on FIG. 13 can be produced, e.g. by additive manufacturing. FIG. 14 is a picture of the support of FIG. 13 after having been produced with a 3D printer.

While this invention has been particularly shown and described with references to example embodiments thereof, it will be understood by those skilled in the art that various changes in form and details may be made therein without departing from the scope of the invention encompassed by the appended claims. For instance, the invention may comprise additive manufacturing a part designed according to the method of the invention. Typically, this is performed by a 3D printer that is a device in which material is joined or solidified under computer control to create the part, with material being added together. The 3D printer typically comprises a memory having recorded thereon the data representing the part. The 3D printer may also comprise a processing unit coupled with a memory for performing the method, e.g. for designing a part by topology optimization. A part (for instance a 3D part) is obtainable by the present invention. The part is optimized, notably the part respects the boundary conditions defined, e.g. by the user. Hence, the performances of the part in service are improved. The (additive) manufactured 3D part thus provides better physical and/or technical characteristics.

The invention claimed is:

1. A computer-implemented method for designing, by topology optimization, an additive manufacturable part, the method comprising:
   defining a working volume for the optimization of the additive manufacturing part;
   defining at least one boundary condition applied to the additive manufacturing part;
   computing, using a processor, a vector field over the working volume, each vector of the field representing an optimal direction and a quantity of material corresponding to satisfy the at least one boundary condition;
   computing, using the processor, a set of flow lines by propagating from starting points in the vector field;
   for each flow line of the set, computing, using the processor, a primary structure element of the additive manufacturinc part, thereby obtaining a primary structure, the primary structure following characteristic directions of a material constitutive of the additive manufacturing part: and
   computing, using the processor, a secondary structure of the additive manufacturing part, the secondary structure consisting of secondary structure elements and linking the set of primary structure elements as well as the secondary structure elements together, the secondary structure stabilizing the primary structure elements.

2. The computer-implemented method of claim 1, wherein the vector field over the working volume is computed using finite element model.

3. The computer-implemented method of claim 2, wherein the vector field over the working volume is computed by an anisotropic free-material optimization that is applied for the finite element model.

4. The computer-implemented method of claim 1, wherein computing a primary structure element of the additive manufacturing part comprises:
   sampling the flow line into a set of points, the set of point comprising at least one of the starting points; and
   computing a polyline from the set of points of the sampled flow line.

5. The computer-implemented method of claim 4, wherein a sampling rate of the flow line is equal to a lattice length scale or to a user selected value.

6. The computer-implemented method of claim 5, wherein the secondary structure comprises segments connecting at least one point of the set of points of a first sampled flow line to one point of the set of points of a second sampled flow line.

7. The computer-implemented method of claim 6, wherein the segments are obtained by computing faces that connect the first and second sampled flow lines.

8. The computer-implemented method of claim 7, wherein the faces are computed by applying a Delaunay meshing of the set of points of the sampled flow lines, triangles or tetrahedra being obtained.

9. The computer-implemented method of claim 1, further comprising:
   computing at least one tertiary structure linking at least two ends of the set of primary structure elements together, wherein the at least one tertiary structure is computed for each region of the working volume that has a density of quantity of material that exceeds a threshold.

10. The computer-implemented method of one of claim 9, wherein the tertiary structure is a solid lump or a shell.

11. The computer-implemented method of claim 1, wherein the primary structure elements computed for each flow line and the secondary structure elements are bars, two bars being connected with one solid sphere, and
   wherein each bar has a section, a dimension of the section being computed from the defined working volume and defined at least one boundary condition.

12. The computer-implemented method of claim 1, further comprising:
   identifying one or more secondary structure elements based on at least one of the following criteria:
      a length of the secondary structure element exceeds a predetermined value,
      the secondary structure elements is located too close from another secondary structure element and
   removing the identified one or more secondary structure elements.

13. The computer-implemented method of claim 1, further comprising:
   transferring the computed vector field on the primary and secondary structure elements closest to where they are placed on the vector field; and
   computing a sizing optimization for each element of the primary and secondary structure elements as design variables.

14. A non-transitory computer readable medium having stored thereon a computer program including instructions for performing a method for designing, by topology optimization, an additive manufacturable part, the method comprising:

defining a working volume for the optimization of the additive manufacturable part;

defining at least one boundary condition applied to the additive manufacturable part;

computing a vector field over the working volume, each vector of the field representing an optimal direction and a quantity of material corresponding to satisfy the at least one boundary condition;

computing a set of flow lines by propagating from starting points in the vector field;

for each flow line of the set, computing a primary structure element of the additive manufacturable part, thereby obtaining a primary structure, the primary structure following characteristic directions of a material constitutive of the additive manufacturable part; and computing a secondary structure of the additive manufacturable part, the secondary structure consisting of secondary structure elements and linking the set of primary structure elements as well as the secondary structure elements together, the secondary structure stabilizing the primary structure elements.

15. A system comprising:

a processor coupled to a memory and a graphical user interface, the memory having recorded thereon a computer program for designing, by topology optimization, an additive manufacturable part that when executed by a processor causes the processor to be configured to:

define a working volume for the optimization of the additive manufacturable part;

define at least one boundary condition applied to the additive manufacturable part;

compute a vector field over the working volume, each vector of the field representing an optimal direction and a quantity of material corresponding to satisfy the at least one boundary condition;

compute a set of flow lines by propagating from starting points in the vector field;

for each flow line of the set, compute a primary structure element of the additive manufacturable part, thereby obtaining a primary structure, the primary structure following characteristic directions of a material constitutive of the additive manufacturable part; and compute a secondary structure of the additive manufacturable part, the secondary structure consisting of secondary structure elements and linking the set of primary structure elements as well as the secondary structure elements together, the secondary structure stabilizing the primary structure elements.

16. A method of additive manufacturing a part designed according to the method of claim 1.

17. The computer-implemented method of claim 2, wherein computing a primary structure element of the part comprises:

sampling the flow line into a set of points, the set of point comprising at least one of the starting points; and computing a polyline from the set of points of the sampled flow line.

18. The computer-implemented method of claim 3, wherein computing a primary structure element of the part comprises:

sampling the flow line into a set of points, the set of point comprising at least one of the starting points; and computing a polyline from the set of points of the sampled flow line.

19. The computer-implemented method of claim 4, wherein the secondary structure comprises segments connecting at least one point of the set of points of a first sampled flow line to one point of the set of points of a second sampled flow line.

20. The computer-implemented method of claim 2, further comprising:

computing at least one tertiary structure linking at least two ends of the set of primary structure elements together, wherein the at least one tertiary structure is computed for each region of the working volume that has a density of quantity of material that exceeds a threshold.

* * * * *